(12) United States Patent
Komljenovic (10) Patent No.: US 11,482,837 B2
(45) Date of Patent: Oct. 25, 2022

(54) INTEGRATED LASER DETECTOR

(71) Applicant: Tin Komljenovic, Goleta, CA (US)

(72) Inventor: Tin Komljenovic, Goleta, CA (US)

(73) Assignee: Nexus Photonics, Inc, Goleta, CA (US)

( * ) Notice: Subject to any disclaimer, the term of this patent is extended or adjusted under 35 U.S.C. 154(b) by 94 days.

(21) Appl. No.: 17/228,706

(22) Filed: Apr. 13, 2021

(65) Prior Publication Data

US 2021/0344170 A1  Nov. 4, 2021

Related U.S. Application Data

(60) Provisional application No. 63/018,989, filed on May 1, 2020.

(51) Int. Cl.
*H01S 5/12* (2021.01)
*H01S 3/067* (2006.01)

(52) U.S. Cl.
CPC .......... *H01S 5/1246* (2013.01); *H01S 5/1231* (2013.01); *H01S 3/06704* (2013.01)

(58) Field of Classification Search
CPC .. H01S 5/1231; H01S 5/1246; H01S 3/06704; H01S 3/0014; G01J 11/00

USPC .......................................... 372/102
See application file for complete search history.

(56) References Cited

U.S. PATENT DOCUMENTS

2018/0059446 A1* 3/2018 Kim .................... G02B 6/30
2018/0102628 A1* 4/2018 Parker ................ G02B 6/29395

\* cited by examiner

*Primary Examiner* — Tuan N Nguyen
(74) *Attorney, Agent, or Firm* — Shalini Venkatesh (57) ABSTRACT

A PIC has first, second and third elements fabricated on a common substrate. The first element includes a structure supporting efficient coupling of one or more free-space optical modes of incident light into one or more waveguide guided optical modes. The second element includes an on-chip interferometer having an input optically coupled to the waveguide guided optical modes; one or more arms; one or more outputs; and a phase tuner configured to change optical path length in one or more of the arms. The third element includes one or more light detecting structures optically coupled to the one or more outputs of the second element, such that variation in optical power in the one or more outputs is detected, allowing an assessment of coherence characterizing the light incident on the first element of the PIC to be provided.

18 Claims, 6 Drawing Sheets

INTEGRATED LASER DETECTOR

CROSS-REFERENCES TO RELATED APPLICATIONS

This application claims priority from U.S. Provisional Patent Application Ser. No. 63/018,989, entitled "INTEGRATED LASER DETECTOR", filed on 1 May, 2020, which is hereby incorporated by reference as if set forth in full in this application for all purposes.

FIELD OF THE INVENTION

The present invention relates to laser detectors. More specifically, certain embodiments of the invention relate to methods and systems for the realization of photonic integrated circuit-based laser detectors.

BACKGROUND OF THE INVENTION

The field of high-powered lasers (both fiber and semiconductor) has improved rapidly in recent years, with power densities increasing by more than an order of magnitude. The need for power was partly driven by demand for industrial cutting machines and long-range (e.g. space) communications, but the same lasers can also be used as directed energy weapons or for target marking that can impact humans (typically eye damage or even burns). Intense research in small, lightweight, high-energy laser systems enabled rapid reduction in the size of directed energy systems, making them easy to disguise.

There is an unmet need for laser alert systems, especially for small size, low weight and low power-consuming (low-SWaP) laser detection systems that can be easily deployed and moved to detect dangerously high levels of laser radiation. Such laser detection systems should be designed to detect only laser radiation and not other background sources. This should be true even if those background sources are of very high brightness such as the sun, headlights, flashes or other bursts of high intensity light not related to lasers.

This present invention includes devices and methods that enable low-SWaP photonic integrated circuit (PIC) based integrated laser detectors (ILD). A PIC is a device that integrates multiple photonic functions and as such is similar to an electronic integrated circuit. The major difference between the two is that a photonic integrated circuit provides functions for information signals imposed on optical waves.

PIC-based realization of the laser detectors of the present invention enables efficient detection of light originating from lasers, without "false positive" detection of light originating from non-laser sources.

DETAILED DESCRIPTION

Described herein are embodiments of methods and systems for realization of photonic integrated circuit-based integrated laser detectors (ILDs). In some of the embodiments described below, the ILD is realized as a PIC including just one optical "unit" of the type 100 shown in FIG. 1 connected to an external electronic unit, while in others, the PIC includes a plurality of similar or identical interconnected "units" or "sub-systems", the plurality sharing a single external electronic unit as shown in FIG. 2.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" means that two or more elements are in direct contact over at least part of their surfaces.

Figure 1:
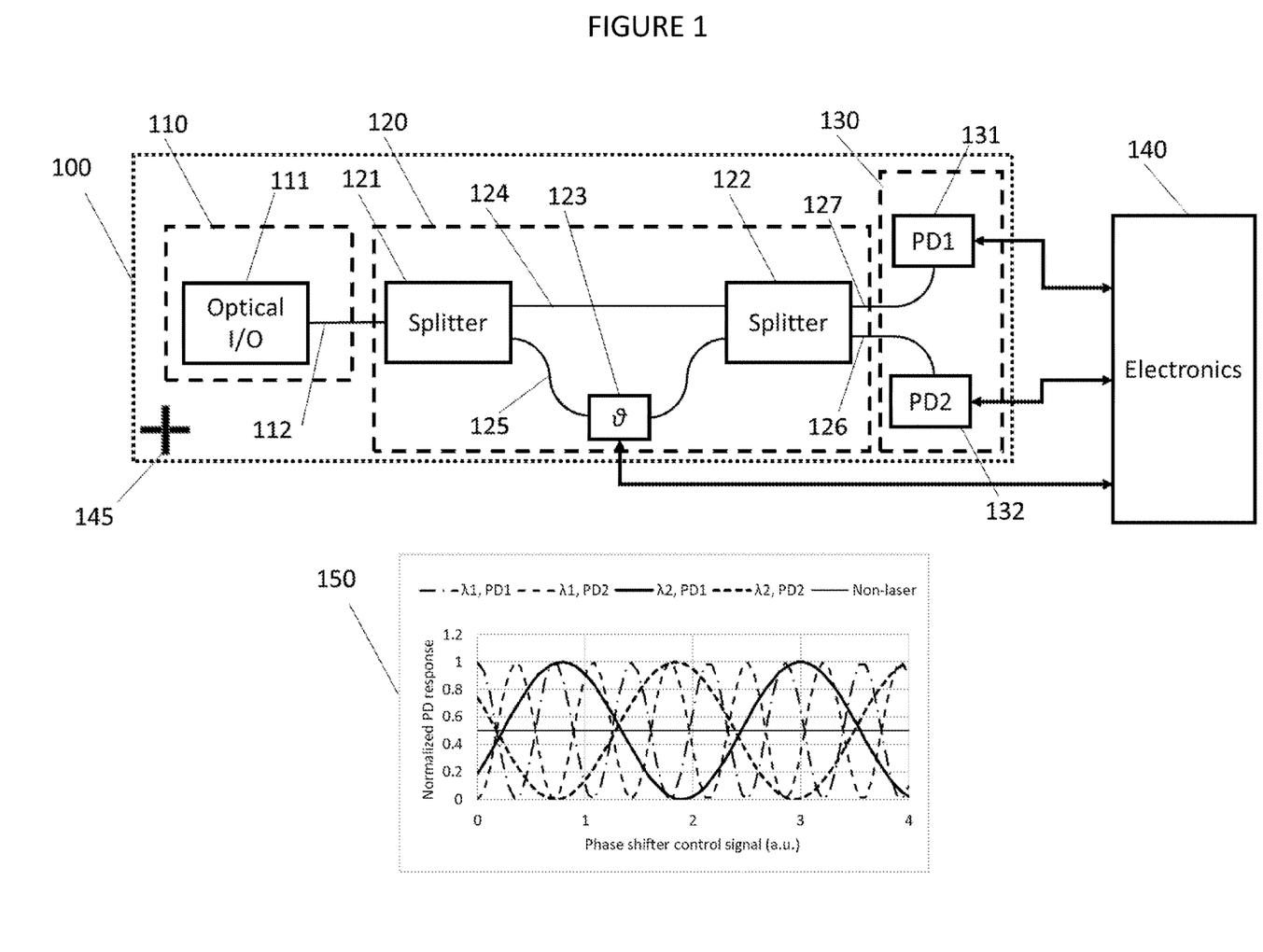
FIG. 1 illustrates a top-down view of a PIC according to one embodiment of the present invention, showing device responses under illumination.
Figure 2:
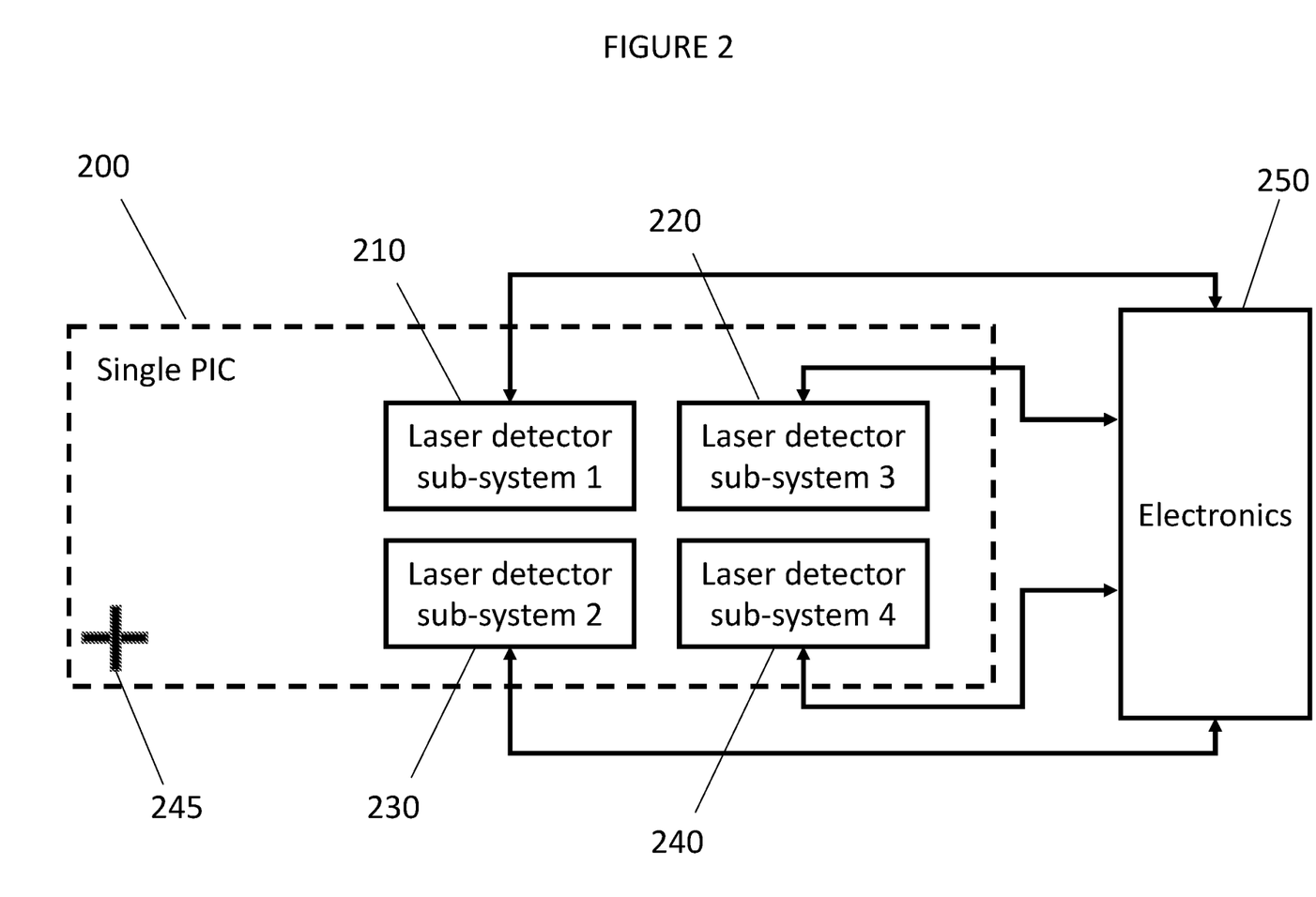
FIG. 2 illustrates a top-down view of a PIC according to one embodiment of the present invention comprising multiple optical sub-systems controlled by single electronic circuit.

FIG. 1 is a schematic top-view of an integrated photonic device 100 showing one embodiment of an integrated laser detector device (or unit or sub-system). In one embodiment, the laser detector sub-system comprises three functional elements 110, 120 and 130. Element 110, which includes elements or structures 111 and part of 112, provides optical coupling functionality which includes efficient coupling of one or more free-space optical modes incident on element 111 into one or more waveguide guided optical modes that are supported by waveguide element 112. Efficient coupling between free-space and guided modes can be provided by edge couplers, corner reflectors, gratings or any other structure 111 providing such functionality. Element 110 is described in more detail later with the help of FIG. 4.

Optical power in one or more modes supported by waveguide 112 is routed to element 120, which provides interferometric functionality. In some embodiments, element 120 is a Mach-Zehnder interferometer comprising two splitting/coupling elements 121 and 122, two arms realized as waveguides 124 and 125, and phase tuner 123. Typical splitter/coupling elements can be realized as directional couplers, multi-mode interference (MMI) couplers, adiabatic couplers or any other mechanisms that provide on-chip power splitting and combining. At least at the operational wavelength or wavelengths of interest, the optical path lengths of the two waveguide arms will not be equal. Optical path length (OPL) is the product of the geometric length of the path followed by light, and the index of refraction of the medium through which it propagates. It is important as it determines the phase of the light as it emerges from that path, and it governs interference. If two paths have different OPL, we can define optical path difference (OPD) which is a difference in optical path length between two paths. OPD is an optimization parameter for element 120 and depends on wavelength of operation, nature of laser light to be detected (single-mode, multimode, etc. with corresponding difference in coherence lengths), phase tuner 123 efficiency and coherence threshold (to be described later). In some embodiments the OPD is greater than 1 μm but less than 1 mm. In other embodiments, the OPD is greater than 1 mm. Phase tuner 123 can modify the OPL of at least one of the arms of the element 120, changing OPD between two arms/paths. The change in OPL is commonly made by changing the refractive index but can also be done by changing the physical length. Examples of phase tuners include thermal phase tuners, semiconductor-based phase tuners, piezoelectric phase tuners or any other suitable structures providing the change in OPL. In yet another embodiment, the OPD is equal to 0 when no control signal is applied to phase tuner 123, and the condition of OPD>0 is generated solely by operation of the phase tuner 123.

In yet other embodiments, element 120 is configured as another type of interferometer such as a Fabry-Perot (described in more detail with the help of FIG. 5), a Michelson, or other interferometer, providing equivalent functionality.

In some embodiments, such as the embodiment shown in FIG. 1, element 120 has one input and two outputs, 126 and 127. These outputs from element 120 are routed to element 130 providing optical to electrical conversion. In the shown embodiment, element 130 comprises two light detecting structures 131 and 132. In other embodiments, not shown, only one structure providing optical to electrical conversion would be present in this element. Light detecting structures convert incident optical signals to electrical signals. Common light detecting structures are semiconductor-based photodetectors, where choice of the semiconductor materials determines their responsivity at particular wavelength. Responsivity is defined as the ratio of current generated to the corresponding incident optical signal.

In other embodiments, element 120 can have a different number of inputs and outputs providing similar functionality. At least one of the outputs of the element 120 is routed to element 130 and optically coupled to a light detecting structure included within 130.

Electronic control circuit 140 generates control signals for elements 123, 131 and 132 and receives signals (currents and/or voltages) from elements 123, 131 and 132. Control signals for element 123 include current and/or voltage signals that result in a change of OPL in at least one of the arms. Signals received from elements 131 and 132 include current and/or voltage signals that can be used to determine the operating point of the element 123. Control signals for elements 131 and 132 can be currents and/or voltages. In one embodiment where elements 131 and 132 are semiconductor photodetectors, the control signals are voltages. Typically, photodetector control is achieved with a 0V signal or a negative voltage signal for increased responsivity and higher bandwidth. In the embodiment where 131 and 132 are semiconductor photodetectors, the received signals are the currents generated by the incident optical signals. Such currents can be detected in many ways, including conversion to voltages, as is commonly done.

An exemplary response of element 100 when exposed to light emitted by a "single-frequency" laser and controlled by electronic circuit 140 is illustrated in 150. Two different set of curves, corresponding to two different laser wavelengths ($\lambda 1$ and $\lambda 2$, $\lambda 2 > \lambda 1$) are shown. The x-axis is the phase shifter control signal in arbitrary units, and the y-axis is the normalized photodetector (PD) received signal for elements 131 (PD1) and 132 (PD2). As the phase tuner signal is swept, the OPD changes and when the modes guided along the separate arms 124, 125 of the interferometer combine in splitter 122, they interfere, with the varying phase difference between them due to the phase tuner resulting in corresponding changes in the power coupled to each of the elements 131 and 132. The optical mode having a shorter wavelength $\lambda 1$ (higher frequency) accumulates larger phase difference for the same OPD, resulting in more rapid change/fringes. This can be used to determine the wavelength of the incident coherent signal or at least the approximate wavelength of the incident coherent signal if it comprises multiple spectral lines (e.g. Q-switched, mode-locked laser or Fabry-Pérot laser).

The illustration 150 is valid for single-frequency coherent light and perfectly balanced power splitting, an ideal phase tuner (no amplitude change) and balanced propagation loss in the two arms. If the incident light is incoherent (non-laser source), the interferometric response is lost and the power detected has a constant value (see the flat response for the non-laser case in 150). The imperfections of power balancing and partial coherence of the incident light result in a response that is in-between the two extremes described above. In a practical ILD, we can define fringe extinction ratio as the ratio of the peak and valley in the response of the photodetector (or other light detecting structure). For a perfectly coherent signal in an ideal system, the fringe extinction ratio is infinity ($\infty$) and for a perfectly incoherent signal in an ideal system, the fringe extinction ratio is 1. In a real case, we can define an extinction ratio threshold or coherence threshold to classify an optical source illumination as either laser or non-laser. If the measured extinction ratio is above the coherence threshold, we classify incident light as laser (coherent) and if it is below the coherence threshold, we classify incident light as non-laser (incoherent). Decision confidence can be improved by including other parameters in the coherence threshold calculation, such as e.g. average incident power, or others. It is clear to one skilled in the art that the coherence threshold is a parameter that can be defined in many ways while serving essentially the same purpose. The coherence threshold may be defined according to the applications of interest, and is closely linked to optimization of the OPD, as practical lasers have finite coherence lengths.

In one of the embodiments, the key functionality of the elements 110 and 120 is realized in dielectrics. Examples of dielectrics include $SiO_2$, SiN, $Al_2O_3$, AlN, $Ta_2O_5$, $LiNbO_3$ and other similar materials suitable for forming the core of a waveguide and other components such as splitters, couplers, edge couplers, gratings, etc. Some parts of element 110 or 120 can be made from additional materials that can be bonded or deposited to provide additional functionality such as phase tuning or similar. The key functionality of element 130 is realized in semiconductors. Examples of suitable semiconductors include Si, Ge, InP and InP-based ternary and quaternary materials, GaAs and GaAs based ternary and quaternary materials, GaN, GaP, InAs and InSb and their variations and derivatives. The material choice is generally driven by wavelength of operation and bandgap of material. Element 130 can also comprise waveguides and other passives realized in dielectrics.

In yet another embodiment, the key functionality of all the elements (110, 120 and 130) is realized in semiconductors. In yet another embodiment the key functionality of elements 120 and 130 is realized in at least part in semiconductors.

One or more lithography alignment marks 145 are typically present, to facilitate precise alignment between the elements formed during various processing steps of the PIC.

In one of the embodiments the cross section of waveguides (e.g. 112, 125, 124, 127, etc.) is designed and fabricated to support only a single TE mode, by selecting waveguide dimensions for particular a wavelength of operation. In one of the embodiments, the thickness of the waveguides is <800 nm; in yet another embodiment, the thickness of the waveguides is <400 nm; and in yet another embodiment the thickness of the waveguides is <150 nm. Typical waveguide widths are in the order of 400 nm to a few μm, optimized for single-mode TE operation for the target wavelength. Other passive components are also optimized for TE operation in such embodiments.

In yet another embodiment, the waveguide dimensions are optimized such that only fundamental TE and TM modes are supported, and birefringence is minimized. This is generally done by keeping the width and thickness of the waveguide similar, but it can also be done with multiple claddings if the width and thickness of the waveguide are not similar. Typical waveguide width and thickness are in the order of 200 nm to few μm. In this case, other passive components are optimized for both TE and TM operation.

In yet another embodiment, on-chip polarization rotators are used to guarantee TE-only operation for components in elements 120 and 130. In this embodiment, a polarization rotator may be included as a part of element 110. In another embodiment, an external polarization rotator (as described below with reference to FIG. 4) can be used.

FIG. 2 is a schematic top-view of an integrated photonic device 200 comprising multiple laser detector sub-systems (210, 220, 230, 240) realized on a common substrate in a wafer-scale semiconductor manufacturing process. It is clear that any number of sub-systems can be used in a practical system, though four sub-systems are shown in FIG. 2 for illustration. Individual sub-systems can be designed to operate at different wavelength bands, can be designed to receive incident light only from certain incident angles, can all be identical, can all be different (e.g. different OPD, number of inputs/outputs, number of light detecting elements, type of light detecting elements or other parameters relevant for laser detection), or can be some mixture of the above options. All of the sub-systems can be controlled by a single electronic circuit 250 and can be manufactured at the same time in a scalable semiconductor process using one or more lithography marks 245. The ability to mass manufacture integrated photonic devices 200 enables significant SWaP-C improvement.

Figure 3:
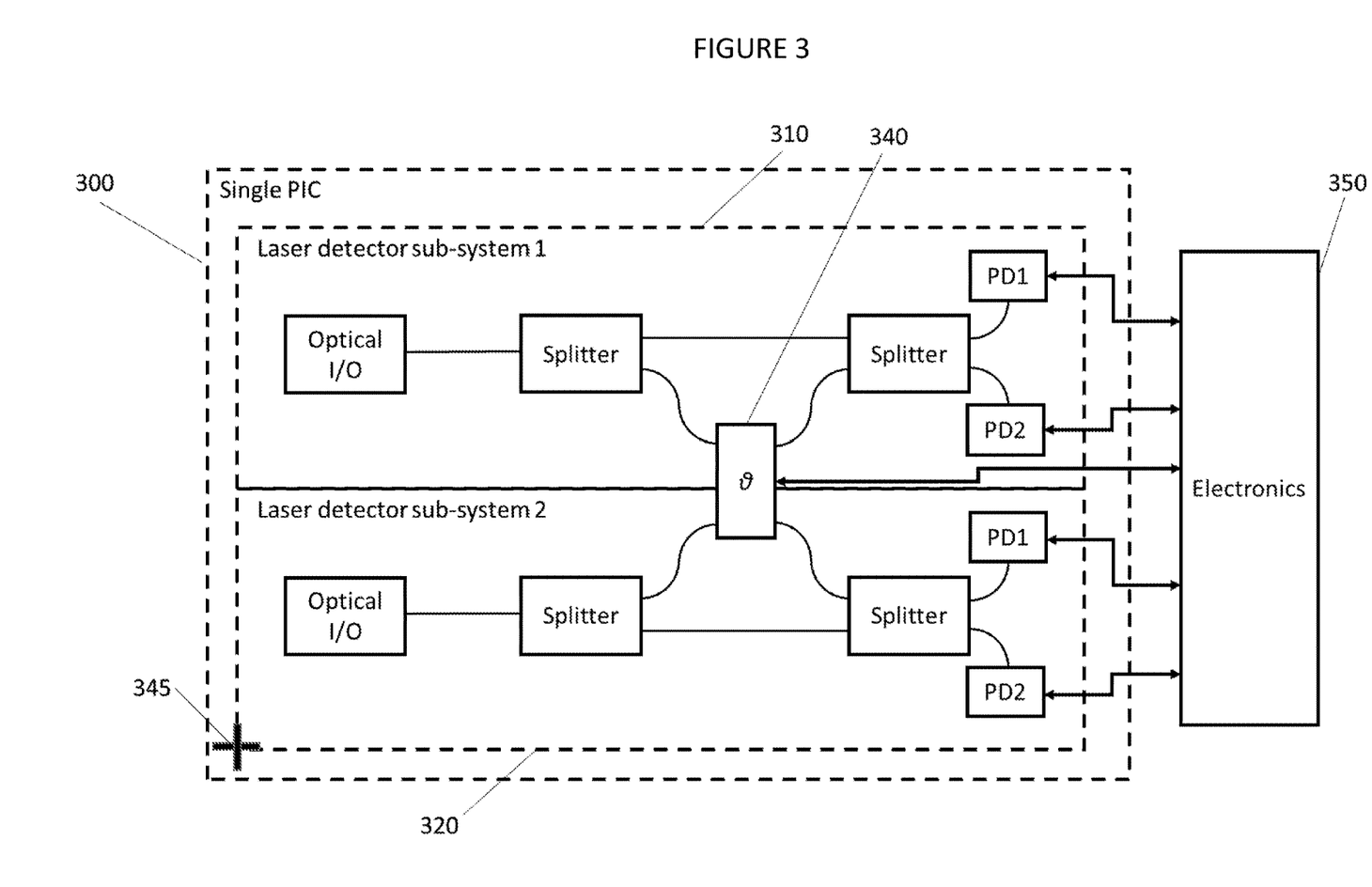
FIG. 3 shows a PIC according to one embodiment of the present invention comprising two optical sub-systems controlled by a single, shared tuner element, shown in top-down view.

FIG. 3 is a schematic top-view of an integrated photonic device 300 comprising multiple (greater than or equal to 2) laser detector sub-systems, two of which 310 and 320 are shown. The functionality of each of the sub-systems includes the functionality of device 100 described above with respect to FIG. 1. The difference is that only one phase tuner 340 is present, shared between the two sub-systems, affecting at least one interferometer arm in each sub-system. This can result in a significant reduction in power consumption for the device as a whole. Although in the embodiment shown in FIG. 3 the phase tuner is shared only between two sub-systems, with optimized routing it is possible to include almost an arbitrarily large number of sub-systems. By sharing one phase tuner 340 among multiple subsystems, control is simplified, and power consumption is reduced, which is important for some applications such as e.g. battery powered ones. All the sub-systems can be controlled by a single electronic circuit 350 and can be manufactured at the same time in a scalable semiconductor process using one or more lithography marks 345.

Figure 4:
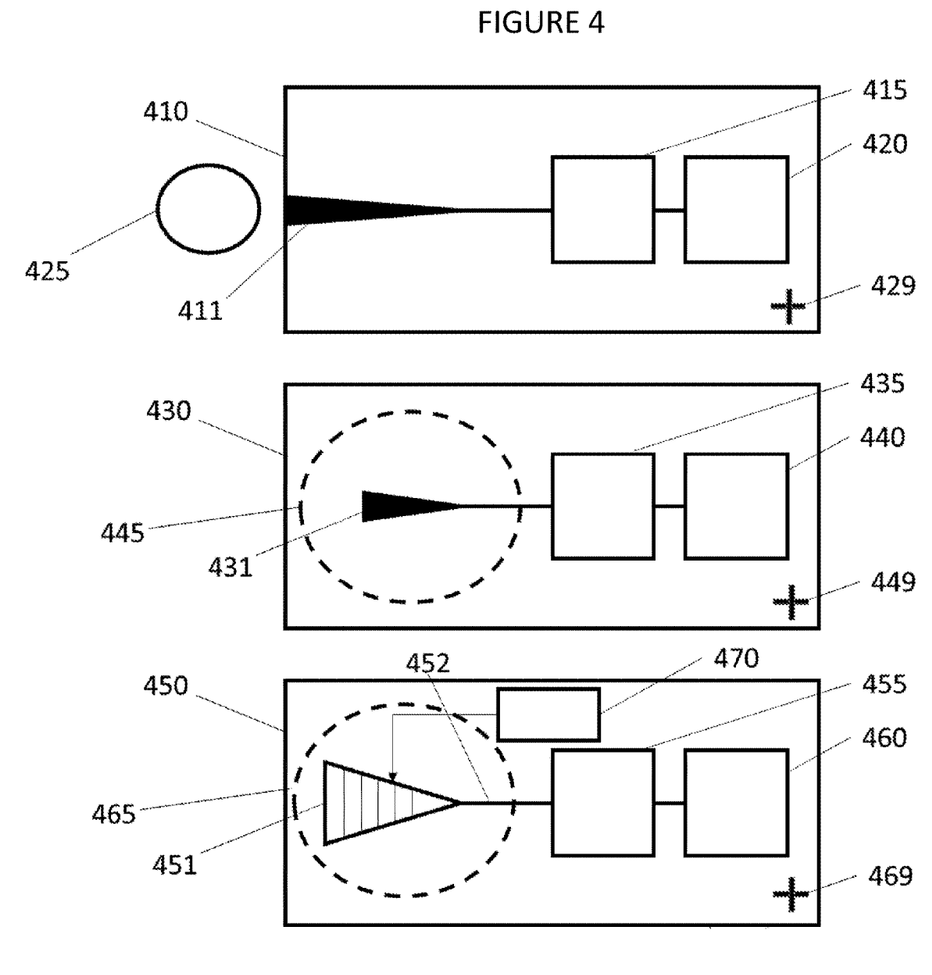
FIG. 4 illustrates top-down views of three PICs according to other embodiments of the present invention.

FIG. 4 is a schematic top-down view of three integrated photonic devices with a lens or polarization control elements to facilitate more efficient coupling between free-space and guided modes.

Integrated photonic device 410 comprises element 415 (whose structure and functionality essentially correspond to those of element 120 of FIG. 1), element 420 (whose structure and functionality essentially correspond to those of element 130 of FIG. 1) and element 411, which is one of the embodiments of element 110 of FIG. 1. In this FIG. 4 embodiment, element 411 includes an edge coupler facilitating coupling between free-space and guided modes. Edge couplers support broadband coupling operation and can support all polarizations. The dimensions of the edge coupler can be optimized as suggested by tapering of a waveguide in element 411. Said taper can enlarge the waveguide dimensions at the facet (as suggested in FIG. 4) but can also reduce the dimensions of the waveguide there (not shown), which is commonly known as an inverse taper. Dimensional change can also be made in the vertical dimension (not shown) or can include additional materials, as is known to a person skilled in the art. In some embodiments, element 425 is introduced to facilitate more efficient coupling between free-space and guided modes and/or control the input polarization. In some embodiments, element 425 is a lens, micro-lens array, quarter-wave plate, polarization rotator, and/or a combination of some or all of those elements. We refer to such elements as mode shaping elements. Element 425 can be integrated with element 410 on a shared substrate (not shown) or can be positioned adjacent to it as shown in FIG. 4. The alignment of components within element 410 (and/or those coupled to it, like 425) can rely on alignment marks 429 during fabrication, or it can be done by passive or active alignment during device assembly.

Integrated photonic device 430 comprises elements 435 and 440 providing identical functionality to that of elements 415 and 420, respectively. Element 431 is a corner reflector facilitating coupling between free-space and guided modes. In contrast to element 411 that supports in-plane coupling, element 431 supports efficient coupling of free-space modes propagating at normal and close to normal angles to the top surface of the PIC. The exact angle of peak optical coupling depends on the design of the corner reflector. Corner reflectors can utilize total internal reflection, reflection, refraction or other mechanisms typically used to reflect and refract the beams. Corner reflector 431 can be placed at the edge of the chip (not shown) or can be fabricated inside the PIC with suitable semiconductor processes such as etching, bonding and/or deposition. Corner reflectors support broadband coupling operation and can support all polarizations. The dimensions of the corner reflector can be optimized similarly to the dimensions of element 411. In some embodiments, element 445 is also present, to facilitate more efficient coupling between free-space and guided modes and/or to control the input polarization. In some embodiments, element 445 is a mode shaping element (a lens, micro-lens array, quarter-wave plate, polarization rotator and/or a combination of some or all of those elements), Element 445 can be integrated with element 430 on a shared substrate or can be assembled separately from the PIC. It can then be placed in direct contact with the PIC or at some distance from the PIC. The alignment of components within or coupled to element 430 can rely on alignment marks 449 during fabrication, or it can be done by passive or active alignment during device assembly.

Integrated photonic device 450 comprises elements 455 and 460 providing identical functionality to that of elements 415 and 420, respectively. Element 451 is a grating, facilitating coupling between free-space and guided optical modes. Gratings can be designed to support efficient coupling from various free-space incident angles to on-chip waveguides. The incident angle at which coupling is most efficient is a function of wavelength, providing both angular and wavelength selectivity to the grating. Some gratings are polarization sensitive, having different coupling efficiency or corresponding incident free-space angle and wavelength pairs for TE and TM polarizations. Dimensions of the gratings can be optimized over a wide range. In some embodiments the area of grating 451 is as small as 2 µm$^2$ and in some embodiments the area of the grating can be as large as 5 mm$^2$ or even larger. In some embodiments a single large grating is used, and in some embodiments various splitting structures and two or more individual gratings are used to efficiently capture parts of the incident free-space mode that are then coherently coupled into a single output waveguide 452. The number of gratings can be very large, and they can be arranged as 1D arrays, 2D arrays or even in randomized patterns. When there are two or more gratings, a grating control element 470 can be used to control the coherent coupling between gratings, primarily by changing the relative phases of the optical signals passing through them. Such phase adjustments may also be considered as a means of steering the optical signals. In some embodiments, element 465 is also present to facilitate more efficient coupling between free-space and guided modes and/or to control the input polarization. In some embodiments, element 465 is a mode shaping element (a lens, micro-lens array, quarter-wave plate, polarization rotator and/or a combination of these elements). Element 465 can be integrated with element 450 on a shared substrate, or it can be assembled separately from the PIC and then placed in direct contact with the PIC or at some distance from the PIC. The alignment of components within or coupled to element 450 can rely on alignment marks 469 or can be done by passive or active alignment during device assembly.

Figure 5:
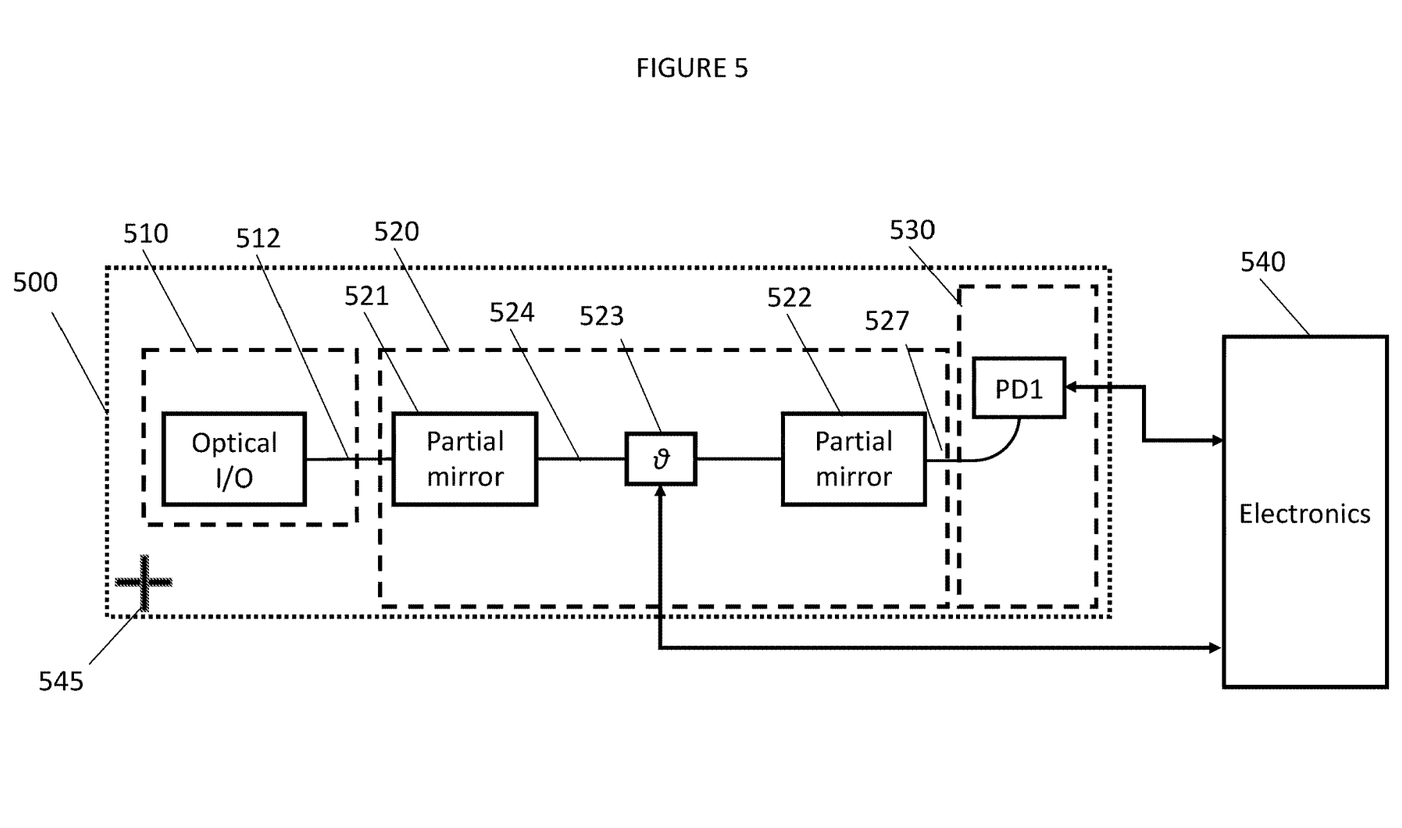
FIG. 5 illustrates a top-down view of a PIC according to one embodiment of the present invention, where the interferometer is realized as a Fabry-Perot structure.

FIG. 5 is a schematic top-down view of an integrated photonic device 500 showing one embodiment of a laser detector sub-system. Similarly to device 100, the laser detector sub-system comprises three functional elements 510, 520 and 530. Element 510 provides optical coupling functionality as previously described with relation to FIGS. 1 and 4. Element 530, similarly to element 130, provides conversion of incident optical signals to electrical signals via one or more light detecting structures Optical power in one or more modes supported by waveguide 512 is routed to element 520 providing interferometric functionality. In the shown embodiment, element 520 is a Fabry-Pérot interferometer comprising at least two partial mirrors 521 and 522 and a delay arm realized as waveguide 524. Typical partial mirrors can be realized as loop-mirrors, gratings, single layer discontinuities or any other mechanism that provides on-chip reflection and transmission. Waveguide 524 forming the cavity between the two partial mirrors can be any length and defines a particular OPL. Its length is an optimization parameter, in the same way as the OPD is for interferometer 120 in device 100. Phase tuner 523 can modify the OPL of waveguide 524 resulting in a corresponding change of interference conditions at the output 527 of element 520, and consequently of the signal generated by any subsequent light detecting elements in element 530. These generated signals can be utilized to determine coherence in the same way as those described with relation to FIG. 1. One or more lithography alignment marks 545 are present to facilitate precise alignment between the elements formed during various processing steps of the PIC.

Figure 6:
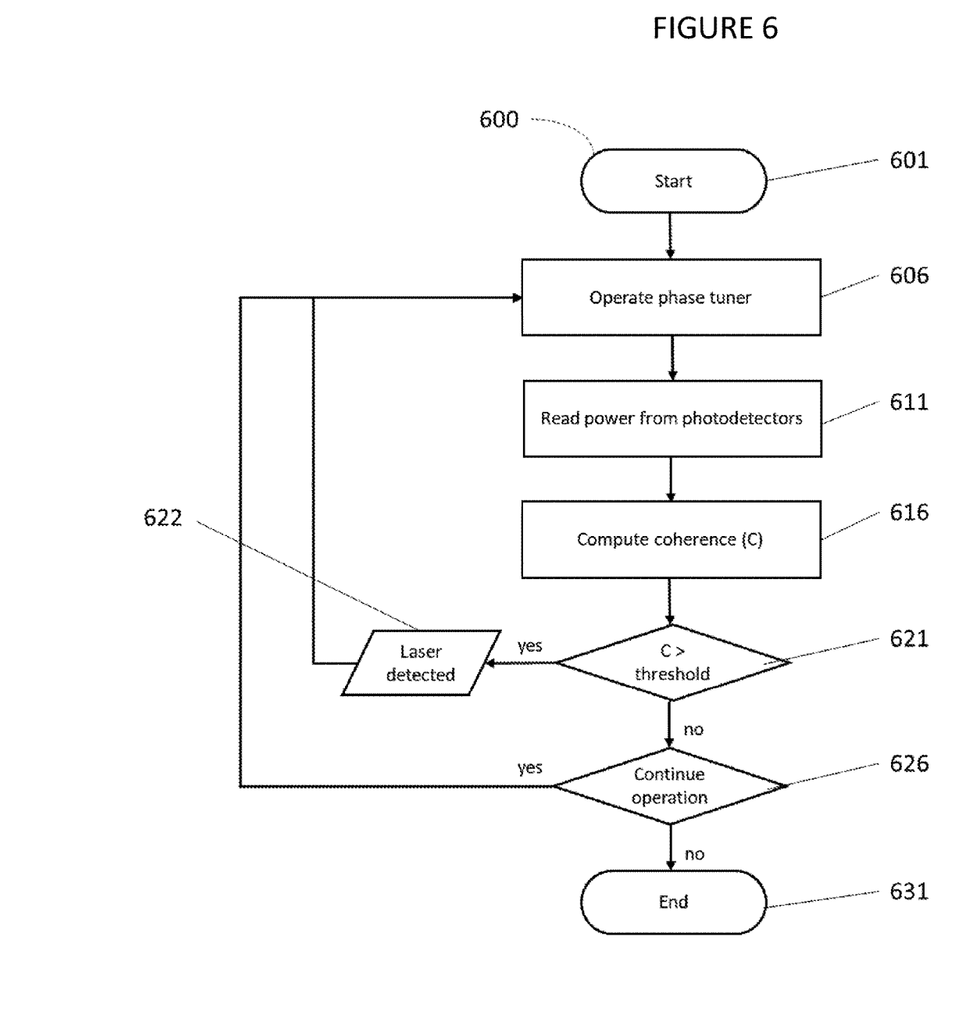
FIG. 6 depicts operations of a method of operation of an integrated laser detector, in accordance with various embodiments described herein.

FIG. 6 depicts steps of a method 600 for the operation of an integrated laser detector, in accordance with various embodiments described herein.

Method 600 begins with step 601, where the integrated laser detector is initialized. At step 606, control signals are applied to a phase tuner. These signals can be preconfigured, can be a result of previously carried out calibrations, or can be generated on the fly. The resulting output from one or more light detecting elements (in one embodiment, these may be semiconductor photodetectors) is read in step 611. At step 616, calculations on the values read in step 611 are performed, and a coherence value (C) is computed from fringe pattern and other relevant parameters, as described above with reference to 150. At step 621, the computed coherence (C) is compared to a threshold, which can be predefined, generated on the fly, determined by calibrations, generated by various learning algorithms or determined in other ways. If the computed coherence (C) is greater than the threshold, step 622 is executed to generate a "laser detected" message, after which the method loops back to step 606. In cases where the computed coherence (C) is less than the threshold, a decision is made at step 626 on whether it is desired to continue operation, possibly in response to user input (not shown) or according to some predetermined timing or other stored system parameter values. In cases where it is determined that the detection operation should be continued, the method loops back to step 606; in other cases the method 600 ends at step 631.

Method 600 is an illustrative method for operation of integrated laser detectors according to the present invention, and it is understood that many variations of the method can be derived, using electronic control circuits such as microcontrollers, field programmable gate arrays, application-specific integrated circuits or other types of electronic devices commonly used to control integrated photonic circuits.

Embodiments of the optical devices described herein may be incorporated into various other devices and systems including, but not limited to, various computing and/or consumer electronic devices/appliances, communication systems, sensors and sensing systems.

It is to be understood that the disclosure teaches just a few examples of illustrative embodiments and that many variations of the invention can easily be devised by those skilled in the art after reading this disclosure. The scope of the present invention is to be determined by the following claims.

The invention claimed is:

1. A PIC-based integrated laser detector comprising:
   first, second and third elements fabricated on a common substrate;
   wherein the first element comprises a structure supporting efficient coupling of one or more free-space optical modes of light incident on the first element into one or more waveguide guided optical modes;
   wherein the second element comprises an on-chip interferometer comprising:
      an input optically coupled to the waveguide guided optical modes;
      one or more arms;
      one or more outputs; and
      a phase tuner configured to change optical path length in one or more of the arms; and
   wherein the third element comprises one or more light detecting structures optically coupled to the one or more outputs of the second element, such that variation in optical power in the one or more outputs is detected, allowing an assessment of coherence characterizing the light incident on the first element to be provided.

2. The PIC-based integrated laser detector of claim 1:
   wherein key functionalities of the first and second elements are realized in dielectric materials; and
   wherein a key functionality of the third element is realized in a semiconductor material.

3. The PIC-based integrated laser detector of claim 1, additionally comprising:
   a fourth element;
   wherein the fourth element provides mode shaping functionality and enhances coupling efficiency between the free-space optical modes and the waveguide guided optical modes.

4. The PIC-based integrated laser detector of claim 1:
   wherein the first element comprises one or more optical gratings; and
   wherein the optical gratings provide filtering based on at least one of wavelength and angle of incidence.

5. The PIC-based integrated laser detector of claim 4, additionally comprising one or more control elements;
   wherein the first element comprises two or more optical gratings; and
   wherein the one or more control elements control coherent combining of power from different ones of the optical gratings.

6. The PIC-based integrated laser detector of claim 4, additionally comprising:
   a fifth element;
   wherein the fifth element provides polarization control functionality and enhances the coupling efficiency between the free-space optical modes and the waveguide guided optical modes, independent of polarization.

7. The PIC-based integrated laser detector of claim 1:
   wherein the first element comprises a corner reflector; and
   wherein the corner reflector provides broadband optical coupling between the free-space optical modes and the waveguide guided optical modes.

8. The PIC-based integrated laser detector of claim 1:
   wherein the first element comprises an edge coupler; and
   wherein the edge coupler provides broadband optical coupling between the free-space optical modes and the waveguide optical modes.

9. The PIC-based integrated laser detector of claim 1, connected to an electronic control circuit;
   wherein the electronic control circuit:
      provides control signals for the phase tuner;
      controls the one or more light detecting structures; and
      reads signals from the one or more light detecting structures.

10. A PIC-based integrated laser detector comprising:
    two or more sub-systems and one or more phase tuners, the subsystems and the one or more phase tuners fabricated on a common substrate;
    wherein each sub-system comprises:
       first, second and third elements;
       wherein the first element comprises a structure supporting efficient coupling of one or more free-space optical modes of light incident on the first element into one or more waveguide guided optical modes;
       wherein the second element comprises an on-chip interferometer comprising:
          an input optically coupled to the waveguide guided optical modes;
          one or more arms; and
          one or more outputs; and
       wherein the third element comprises one or more light detecting structures optically coupled to the one or more outputs of the second element, such that variation in optical power in the one or more outputs is detected, providing a determination of coherence characterizing the incident light;
    wherein one of the one or more phase tuners is shared between two or more of the sub-systems, being configured to change optical path length in one or more of the arms in the corresponding two or more interferometers.

11. A method of assessing coherence of incident light comprising one or more free space optical modes; the method comprising:
    intercepting the one or more free space optical modes with a PIC-based integrated laser detector comprising:
       first, second and third elements fabricated on a common substrate;
       wherein the first element comprises a structure supporting efficient coupling of the one or more free-space optical modes into one or more waveguide guided optical modes;
       wherein the second element comprises an on-chip interferometer comprising:
          an input optically coupled to the waveguide guided optical modes;
          one or more arms;
          one or more outputs; and
          a phase tuner configured to change optical path length in one or more of the arms; and
       wherein the third element comprises one or more light detecting structures optically coupled to the one or more outputs of the second element;
    operating the phase tuner, such that an optical path length of at least one arm of the interferometer is adjusted;
    receiving one or more signals from the one or more light detecting structures as the phase tuner is operated; and
    providing a measure of coherence of the incident light, based on analysis of the received one or more signals.

12. The method of claim 11,
wherein operating the phase tuner comprises operating an electronic control circuit connected to the integrated laser detector, such that a control signal is generated and supplied to the phase tuner.

13. The method of claim 11,
wherein providing a measure of coherence of the incident light comprises:
analyzing the one or more signals received from the light detecting structures to yield a measure of fringe extinction ratio; and
comparing the measure of fringe extinction ratio with a predetermined threshold of fringe extinction ratio.

14. The method of claim 13,
wherein providing a measure of coherence of the incident light further comprises analyzing the one or more signals received from the light detecting structures to yield a measure of average power.

15. The method of claim 11, wherein providing a measure of coherence of the incident light comprises operating an electronic control circuit connected to the integrated laser detector.

16. The method of claim 11,
wherein key functionalities of the first and second elements are realized in dielectric materials; and
wherein a key functionality of the third element is realized in a semiconductor material.

17. The method of claim 11,
wherein the integrated laser detector additionally comprises a fourth element, the fourth element providing mode shaping functionality and enhancing coupling efficiency between the free-space optical modes and the waveguide guided optical modes.

18. The method of claim 11:
wherein the first element comprises one or more optical gratings; and
wherein the optical gratings provide filtering based on at least one of wavelength and angle of incidence.

* * * * *